United States Patent [19]
Rigby

[11] Patent Number: 6,146,816
[45] Date of Patent: Nov. 14, 2000

[54] DEVELOPMENT OF RADIATION SENSITIVE COMPOSITIONS

[75] Inventor: Stephen David Rigby, Morley, United Kingdom

[73] Assignee: Agfa-Gevaert, N.V., Mortsel, Belgium

[21] Appl. No.: 09/453,723

[22] Filed: Dec. 3, 1999

[30] Foreign Application Priority Data

Dec. 3, 1998 [GB] United Kingdom ................... 9826457

[51] Int. Cl.⁷ ....................................................... G03F 7/32
[52] U.S. Cl. ............................................. 430/331; 510/176
[58] Field of Search .............................. 430/331; 510/176

[56] References Cited

U.S. PATENT DOCUMENTS 5,466,559   11/1995   Miller et al. ............................ 430/331

FOREIGN PATENT DOCUMENTS 03174538   7/1991   Japan .

*Primary Examiner*—Hoa Van Le
*Attorney, Agent, or Firm*—Breiner & Breiner

[57] ABSTRACT

Developer liquids for negative working radiation sensitive compositions are provided, the developers including an alkyl ester of a hydroxy carboxylic acid, preferably the n-butyl ester of glycolic acid. The developer liquids have a pH in the range of from 7.0 to 9.5 and preferably also comprise an alkaline material, an anionic surfactant, a hydrotrope or solubilising agent and an etching agent and optionally include sequestering agents, buffering agents biocides and the like. The developer liquids are biodegradable and do not persist in the environment, thereby facilitating the avoidance of effluent and disposal problems and associated health, safety and environmental concerns. A method for the development of an imagewise exposed, negative working photosensitive composition is also provided, with particular reference to precursors for lithographic printing plates.

18 Claims, No Drawings

DEVELOPMENT OF RADIATION SENSITIVE COMPOSITIONS

FIELD OF THE INVENTION

This invention relates to the development of radiation sensitive compositions and is concerned with the development of such compositions as are used for the production of printing plates and photoresists.

In the production of printing plates and photoresists, a radiation sensitive composition is coated on to a substrate to form a radiation sensitive plate, which is then imagewise exposed to radiation in order to selectively expose different areas of the coating. The resulting radiation struck areas and non-radiation struck areas have differing solubility in developer liquids and, hence, the more soluble areas may be selectively removed from the substrate by the application of a suitable developer liquid, thereby leaving an image on the substrate comprising the less soluble areas.

Conventional radiation sensitive compositions are generally classified as being either positive working or negative working. Positive working compositions are characterised by the fact that they become more soluble in a given developer liquid when exposed to radiation, whereas negative working compositions have the property of becoming less soluble following such exposure.

Generally, however, the developer liquids required for use in conjunction with the two classes of composition are substantially different. Thus, whilst alkaline aqueous developers are suitable for development of positive working compositions, negative working compositions have, for the most part, necessitated the application of developer liquids including a substantial proportion of an organic solvent. Typical solvents which have been employed in these developer liquids have included aralkyl alcohols such as benzyl alcohol, and aryloxyalkyl alcohols, for example phenoxyethanol. Unfortunately, however, such solvents—even in relatively small amounts—are known to suffer from serious drawbacks in terms of health, safety and the environment. In particular, it is found that these compounds are not biodegradable and, consequently, tend to persist in the environment.

It is an object of the present invention to provide a developer liquid for negative working compositions which avoids the use of solvents which persist in the environment.

It is a further object of the present invention to provide a developer liquid for negative working compositions which is not associated with the health, safety and environmental problems which are characteristic of prior art formulations.

According to a first aspect of the present invention there is provided a developer liquid which includes an alkyl ester of a hydroxy carboxylic acid.

Preferred derivatives are alkyl esters of α-hydroxy substituted carboxylic acids of the formula I

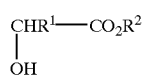

wherein $R^1$ is a hydrogen atom or an alkyl, aryl or aralkyl group and $R^2$ is an alkyl group.

Particularly, preferred derivatives are those in which $R^1$ is a hydrogen atom or a $C_1$–$C_4$ alkyl group and $R^2$ is a $C_2$–$C_6$ alkyl group; in each case the alkyl group may be either branched or straight-chain. Of particular interest are those derivatives wherein $R^1$=H or $CH_3$ and $R^2$=$C_3H_7$ or $C_4H_9$, ie the propyl or butyl esters of glycolic and lactic acid, with especially advantageous results having been achieved with the n-butyl ester of glycolic acid, having the formula II

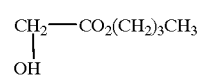

Preferably the alkyl ester of a hydroxy carboxylic acid is present at a level of 2 to 20% vol/vol in the developer liquid, most preferably 5 to 10% vol/vol.

The developer liquid preferably also comprises an alkaline material, an anionic surfactant, a hydrotrope or solubilising agent and an etching agent.

Suitable alkaline materials include carbonates, bicarbonates or phosphoric acid salts of alkali metals, such as sodium bicarbonate or trisodium phosphate or organic bases, particularly amino compounds such as monoethanolamine or triethanolamine, or combinations of these derivatives. The alkaline material is advantageously present at a level of 1 to 10% wt/vol, preferably 1 to 3% wt/vol.

Anionic surfactants having application in the developer liquids of the present invention are preferably sulphonated derivatives and include mono- or di-alkyl naphthalene sulphonates, $C_6$ to $C_{12}$ alcohol sulphonates or sulphonated alcohol esters. The surfactants are generally present in an amount of 1 to 10% vol/vol, preferably 3 to 5% vol/vol, and assist in the removal of unwanted coating from the plate surface.

Hydrotropes or solubilising agents are included in the developer liquids to provide dissolution of spent coating therein, thereby improving the efficiency of development. Suitable materials include basic soaps such as the alkali metal salts of carboxylic acids, particularly aryl carboxylic acids or alkyl carboxylic acids having at least a $C_6$ chain, for example the sodium salts of acids such as benzoic acid, octanoic acid, 2-ethylhexanoic acid or heptanoic acid. Combinations of these derivatives may also be included, and particularly favourable results have been achieved with a combination of sodium octanoate and sodium benzoate. Suitable levels of addition of these materials are from 0.1 to 10% wt/vol preferably from 0.5 to 7.5% wt/vol.

The presence of an etching agent in the developer liquid assists in attaining a clean substrate surface in those areas in which unwanted coating is removed, and thereby ensures that clean, high quality images, free from background contamination, may be achieved. Typical etching agents finding application in the present invention include the sodium or potassium salts of tartaric, citric or gluconic acid, for example sodium tartrate. The etching agent is generally present at a level of 0.5 to 10% wt/vol, preferably 1 to 5% wt/vol.

In all cases, the developer liquid is diluted to volume with water, and the pH is then adjusted to be in the range of 7.0 to 9.5, typically by the addition of a weaker acid such as phosphoric acid. The preferred value for the pH is in the region of 8.0.

The developer liquid may optionally include other additives such as sequestering agents, buffering agents, biocides and the like.

According to a second aspect of the present invention, there is provided a method for developing an imagewise exposed, negative working photosensitive composition, said method comprising the step of contacting the composition with a developer liquid comprising an alkyl ester of a hydroxy carboxylic acid.

Said development method is preferably applied to an imagewise exposed lithographic printing plate precursor, and may be carried out manually using, for example, a soft cloth to wipe away the developer and dissolved unwanted coating from the non-image areas. Most conveniently for lithographic printing plates, however, the development process takes place in an automatic developing machine or plate processor of the type which are generally commercially available, such as the Autoneg™ processor supplied by DuPont Printing and Publishing.

The development method of the present invention is applicable to a wide range of negative working photosensitive compositions, including those incorporating diazo or azide materials or polyunsaturated monomers or prepolymers as the photosensitive agent, and optionally also containing binder resins such as acrylate resins, styrenelmaleic anhydride copolymers, carboxylated poly(vinyl acetal) resins or sulphonamide resins. The negative working compositions may also contain other components such as shading dyes, colour change dyes, sensitisers, photoinitiators and the like.

The negative working photosensitive compositions are typically coated on any suitable substrate which, in the case of lithographic printing plates, may be, for example, a paper or plastic substrate but, in general, will comprise an aluminium substrate which has preferably been grained and anodised to improve its printing properties.

A negative working printing plate precursor of this type comprising a negative working photosensitive composition and a substrate may be imagewise exposed through a photographic negative, typically by means of a printing-down frame incorporating a source of ultra-violet radiation to provide an imaged plate, which may then be developed according to the invention, prior to use on a printing press.

Following the development of a series of photosensitive members comprising negative working photosensitive compositions according to the method of the second aspect of the present invention, the developers of the first aspect of the present invention become exhausted and can no longer perform the development function efficiently. At that stage, the exhausted, or spent, developer is removed from the processor and replaced with fresh developer.

However, whilst the developers of the prior art contained toxic, non-biodegradable solvents and, therefore, gave rise to significant effluent problems, the developers of the present invention contain only biodegradable components, such that the spent developers generated do not suffer from such effluent and disposal problems.

The invention will now be illustrated, though without limitation, by reference to the following examples:

EXAMPLES

Example 1

A negative working presensitised printing plate, consisting of a grained and anodised aluminium substrate coated with a composition containing a diazodiphenylamine/formaldehyde condensate and a binder resin comprising the reaction product of poly(vinyl butyral) and phthalic anhydride was imagewise exposed through a photographic negative in a printing down frame.

The plate was then processed through an Autoneg™ Plate Processor containing, in the developer section, a developer solution having the formulation:

| | |
|---|---|
| Triethanolamine | 20 ml |
| Sodium Alkyl Naphthalene Sulphonate | 40 ml |
| n-Butyl Glycolate | 70 ml |
| Sodium Octanoate | 50 ml |
| Sodium Benzoate | 15 g |
| Sodium Tartrate | 25 g |
| Demineralised Water | to 1000 ml |

Phosphoric acid was added to adjust the pH to 8.0

Printing plates showing good image definition and having a clean background in non-image areas were produced. The spent developer was fully biodegradable and produced no effluent or disposal problems.

Example 2

The experiment of Example 1 was repeated, with the exception that the n-butyl glycolate was replaced with an equal volume of n-propyl lactate.

Again, printing plates showing good image definition and having a clean background in non-image areas were produced and the spent developer was fully biodegradable and produced no effluent or disposal problems.

Example 3

The experiment of Example 1 was repeated, with the exception that the n-butyl glycolate was replaced with an equal volume of isobutyl lactate.

The resulting printing plates again showed good image definition and had a clean background in non-image areas. The spent developer was fully biodegradable and produced no effluent or disposal problems.

Example 4

The experiment of Example 1 was repeated, with the exception that the n-butyl glycolate was replaced with an equal volume of isopropyl glycolate.

This experiment again produced printing plates showing good image definition and having a clean background in non-image areas, the spent developer being fully biodegradable and producing no effluent or disposal problems.

Example 5

The experiment of Example 1 was repeated with the exception that the n-butyl glycolate was replaced with an equal volume of ethyl 2-hydroxycaproate.

Printing plates showing satisfactory image definition and having a clean background in non-image areas were produced, and the spent developer was fully biodegradable and produced no effluent or disposal problems.

Example 6

The experiment of Example 1 was repeated with the exception that the n-butyl glycolate was replaced with an equal volume of n-propyl 2-hydroxyisobutyrate.

The printing plates showed acceptable image definition and had a clean background in non-image areas. The spent developer was again fully biodegradable and produced no effluent or disposal problems.

What is claimed is:

1. A developer liquid for negative working radiation sensitive compositions which includes an alkyl ester of a hydroxy carboxylic acid.

2. A developer liquid as defined in claim 1 wherein said ester comprises an alkyl ester of an α-hydroxy carboxylic acid and has the formula

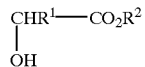

I wherein $R^1$ is a hydrogen atom or an alkyl, aryl or aralkyl group and $R^2$ is an alkyl group.

3. A developer liquid as defined in claim 2 wherein $R^1$ comprises a hydrogen atom or a $C_1$–$C_4$ alkyl group and $R^2$ comprises a $C_2$–$C_6$ alkyl group, said alkyl groups being either branched- or straight-chain.

4. A developer liquid as defined in claim 3 wherein said ester comprises at least one of the propyl or butyl esters of glycolic or lactic acid.

5. A developer liquid as defined in claim 4 wherein said ester comprises the n-butyl ester of glycolic acid having the formula

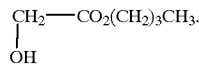

6. A developer liquid as defined in claim 1 wherein said ester is present at a level of from 2 to 20% vol/vol.

7. A developer liquid as defined in claim 1 which additionally comprises an alkaline material, an anionic surfactant, a hydrotrope or solubilising agent and an etching agent.

8. A developer liquid as defined in claim 7 wherein said alkaline material comprises an organic base or a carbonate, bicarbonate or phosphoric acid salt of an alkali metal and is present at a level of from 1 to 10% wt/vol.

9. A developer liquid as defined in claim 7 wherein said anionic surfactant comprises at least one of a mono- or di-alkyl naphthalene sulphonate, a $C_6$ to $C_{12}$ alcohol sulphonate or a sulphonated alcohol ester and is present in an amount of from 1 to 10% vol/vol.

10. A developer liquid as defined in claim 7 wherein said hydrotrope or solubilising agent comprises at least one alkali metal salt of an aryl carboxylic acid or an alkyl carboxylic acid having at least a $C_6$ chain.

11. A developer liquid as defined in claim 10 wherein said hydrotrope or solubilising agent comprises a combination of sodium octanoate and sodium benzoate and is present at a level of from 0.1% to 10% wt/vol.

12. A developer liquid as defined in claim 7 wherein said etching agent comprises the sodium or potassium salt of tartaric, citric or gluconic acid.

13. A developer liquid as defined in claim 1 wherein the pH is adjusted to be in the range of from 7.0 to 9.5.

14. A developer liquid as defined in claim 13 wherein said pi is adjusted to be in the region of 8.0 by the addition of phosphoric acid.

15. A developer liquid as defined in claim 1 which additionally includes at least one of a sequestering agent, a buffering agent or a biocide.

16. A method for developing an imagewise exposed, negative working photosensitive composition, said method comprising the step of contacting the composition with a developer liquid comprising an alkyl ester of a hydroxy carboxylic acid.

17. A method as defined in claim 16 wherein said negative working photosensitive composition is comprised in a lithographic printing plate precursor including a substrate.

18. A method as defined in claim 17 wherein said substrate comprises grained and anodised aluminium.

* * * * *